US010609830B1

(12) United States Patent
Robl et al.

(10) Patent No.: US 10,609,830 B1
(45) Date of Patent: Mar. 31, 2020

(54) INTERFACE MODULE FOR A DEVICE UNIT AND DEVICE UNIT FOR A TRANSMITTER AS WELL AS MOUNTING METHOD OF A DEVICE UNIT

(71) Applicant: Endress+Hauser Conducta GmbH+Co. KG, Gerlingen (DE)

(72) Inventors: Stefan Robl, Hünxe (DE); Michael Dieterich, Waiblingen (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 0 days.

(21) Appl. No.: 16/571,351

(22) Filed: Sep. 16, 2019

(30) Foreign Application Priority Data

Sep. 24, 2018 (DE) .................. 10 2018 123 430

(51) Int. Cl.
*H05K 5/00* (2006.01)
(52) U.S. Cl.
CPC ......... *H05K 5/0017* (2013.01); *H05K 5/0004* (2013.01); *H05K 2201/10128* (2013.01); *H05K 2201/10151* (2013.01)

(58) Field of Classification Search
CPC .............. H05K 5/0017; H05K 5/0004; H05K 2201/10128; H05K 2201/10151; G06F 1/26; G06F 1/1616; H04M 1/0218
See application file for complete search history.

(56) References Cited

U.S. PATENT DOCUMENTS

2005/0224329 A1\* 10/2005 Milo ...................... E05B 17/22
200/341

\* cited by examiner

*Primary Examiner* — Devan A Sandiford
(74) *Attorney, Agent, or Firm* — Mark A. Logan; PatServe

(57) ABSTRACT

The invention relates to an interface module for a device unit, comprising a communication unit suitable for being communicatively connected to an electronics module of the device unit, the communication unit being suitable for enabling the input of information by a user and/or the output of information to a user; a holding element suitable for being fastened to the electronics module; and a connection connecting the communication unit and the holding element to one another, wherein the connection is a joint, and the communication unit is movable relative to the holding element between a first folding position and a second folding position by means of the joint.

15 Claims, 4 Drawing Sheets

INTERFACE MODULE FOR A DEVICE UNIT AND DEVICE UNIT FOR A TRANSMITTER AS WELL AS MOUNTING METHOD OF A DEVICE UNIT

CROSS-REFERENCE TO RELATED APPLICATION

The present application is related to and claims the priority benefit of German Patent Application No. 10 2018 123 430.9, filed on Sep. 24, 2018, the entire contents of which are incorporated herein by reference.

TECHNICAL FIELD

The present disclosure relates to an interface module of a device unit, to a device unit for a transmitter, and to a mounting method for the device unit.

BACKGROUND

In the prior art, measuring devices, also referred to as transmitters, are known which are used to measure or monitor process variables. A transmitter comprises a sensor element, which generates a measurement variable that is dependent on the process variable or on a change in the process variable. The sensor element is usually arranged in a housing in order to be protected against environmental conditions. An electronics module for controlling or further processing the measurement variable is also usually present in the housing. An interface module for controlling or monitoring the transmitter by a user can also be arranged in the housing. In this way, for example, the measuring range of the transmitter can be set or controlled.

Depending on the spatial circumstances of the measuring location, the transmitter can be arranged in a wide variety of positions. However, some positions of the transmitter make it difficult to install, control or monitor the transmitter.

SUMMARY

An object of the present disclosure is to make the installation, control and monitoring of transmitters more convenient for the user.

This object is achieved by an interface module for a device unit according to claim 1.

The interface module according to the present disclosure for a device unit comprises: a communication unit suitable for being communicatively connected to an electronics module of the device unit, the communication unit being suitable for enabling the input of information by a user and/or the output of information to a user; a holding element suitable for being fastened to the electronics module; a connection connecting the communication unit and the holding element to one another, wherein the connection is a joint, and the communication unit is movable relative to the holding element between a first folding position and a second folding position by means of the joint.

The interface module according to the present disclosure has the advantage that the communication unit cannot fall off the device unit when the holding element is fastened to the electronics module of the device unit. Likewise, the joint allows the communication unit to pivot from the holding element during mounting of the transmitter, making mounting of the transmitter more convenient.

According to one embodiment, the holding element is annular and comprises a fastening element suitable for being connected to an annular fastening element of the electronics module, the two fastening elements allowing the holding element to rotate relative to the electronics module between a first rotational position and a second rotational position when the fastening elements are connected to one another.

According to one embodiment, the communication unit comprises a tooth suitable for engaging in at least a first recess of the electronics module which is complementary to the tooth, in order to prevent the holding element from rotating relative to the electronics module when the tooth engages in the recess.

According to one embodiment, the interface module comprises a locking device suitable for locking the communication unit in the first folding position relative to the holding element.

According to one embodiment, the locking device is a first locking element fastened to the communication unit, and comprises a second locking element fastened to the holding element, wherein the first and second locking elements are complementary to one another.

According to one embodiment, the interface module comprises a tensioning element suitable for moving the communication unit relative to the holding element into the second folding position.

The object according to the present disclosure is further achieved by a device unit for a transmitter according to claim 7.

The device unit according to the present disclosure for a transmitter comprises: an electronics module; an interface module according to the present disclosure, wherein the holding element of the interface module is connected to the electronics module.

Such a device unit allows the communication unit to be arranged in a position accessible to the user in order to mount, monitor or control a transmitter.

According to a further embodiment, the electronics module comprises an annular fastening element connected to an annular fastening element of the holding element, the fastening elements allowing the holding element to rotate relative to the electronics module between a first rotational position and a second rotational position.

According to one embodiment, the electronics module has at least a first recess suitable for receiving a tooth of the communication unit which is complementary to the first recess in order to prevent the holding element from rotating relative to the electronics module when the tooth engages in the recess.

According to one embodiment, the electronics module has a second recess, wherein the first recess of the electronics module is suitable for receiving the tooth of the communication unit when the holding element is in the first rotational position relative to the electronics module, and wherein the second recess of the electronics module is suitable for receiving the tooth of the communication unit when the holding element is in the second rotational position relative to the electronics module.

According to one embodiment, the electronics module comprises an electronic connection point suitable for receiving a first cable, wherein the electronic connection point is accessible to a user when the communication unit is in the second folding position relative to the holding element.

According to one embodiment, the communication module comprises an electronic connection point, wherein the electronic connection point of the communication module and the electronic connection point of the electronics module are connected to one another by a second cable.

According to one embodiment, the electronics module has an opening suitable for receiving the first cable, wherein the opening and the electronic connection point of the electronics module are simultaneously accessible to a user when the communication unit is in the second folding position relative to the holding element.

The object according to the present disclosure is further achieved by a mounting method of a device unit according to claim 14.

The mounting method according to the present disclosure of a device unit according to the present disclosure for a transmitter, the mounting method comprising the following steps: providing an interface module according to the present disclosure; providing an electronics module; fastening the holding element of the interface module to the electronics module; moving the communication unit of the interface module into the second folding position to make an electronic connection point of the electronics module accessible to an operator for the connection to a cable; and moving the communication unit of the interface module into the first folding position.

The mounting method according to the present disclosure enables simple and convenient mounting of a device unit for a transmitter. The mounting method also enables convenient control and monitoring of the transmitter.

According to one embodiment, after the step of moving the communication unit of the interface module into the second folding position, a step of rotating the holding element of the interface module from a first rotational position into a second rotational position is carried out.

The present disclosure is explained in more detail based on the following description of the figures. They show:

FIG. 1: a transmitter comprising a device unit according to the present disclosure;

FIG. 2: a device unit according to the present disclosure;

FIG. 3: an exploded view of an interface module of the device unit from FIG. 2 comprising a holding element, a communication unit, a connection and a tensioning element;

FIG. 4: an electronics module of the device unit from FIG. 2;

FIG. 5: the device unit from FIG. 2, with the communication unit in a first folding position and a first rotational position;

FIG. 6: the device unit from FIG. 2, with the communication unit in a second folding position and the first rotational position;

FIG. 7: the device unit from FIG. 2, with the holding element in the second folding position and the second rotational position; and FIG. 8: the device unit from FIG. 2, with the holding element in the first folding position and the second rotational position.

Figure 1:
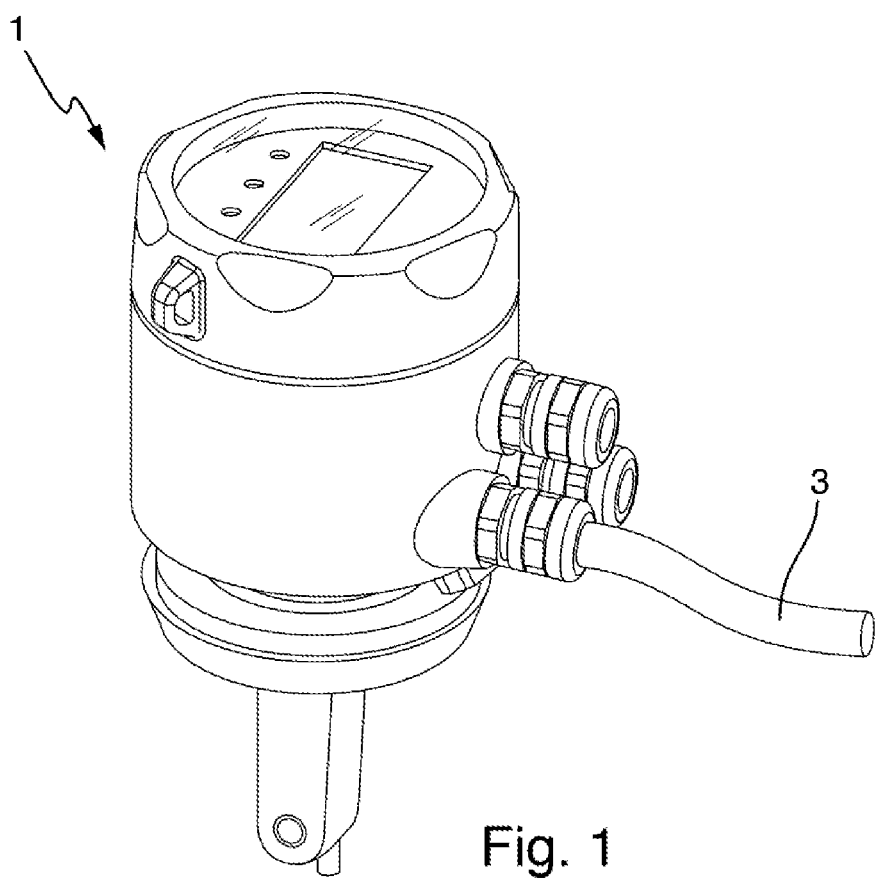
FIG. 1 shows a transmitter 1 comprising a transmitter housing and a sensor protruding downward from the transmitter housing. The housing has an upper side with a viewing window that allows a user of the transmitter to look inside the transmitter. Located in the housing behind the viewing window is a device unit 2, which is connected to the sensor. The device unit 2 allows the sensor to be controlled and the measurement values measured by the sensor to be checked. The housing further includes a cable duct arranged laterally in order to guide at least a first cable 3 into the interior of the housing. A detailed view of the device unit 2 without the housing and without the connection to the sensor is illustrated in FIG. 2.
Figure 2:
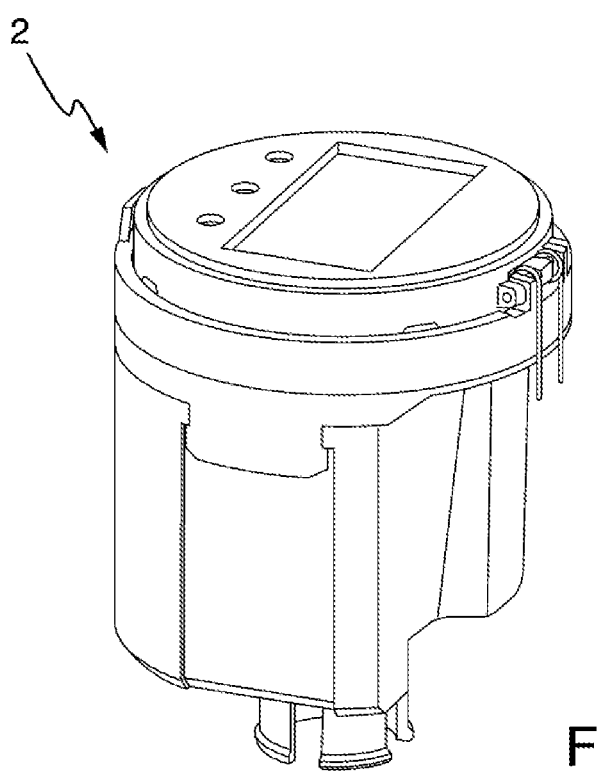
Figure 3:
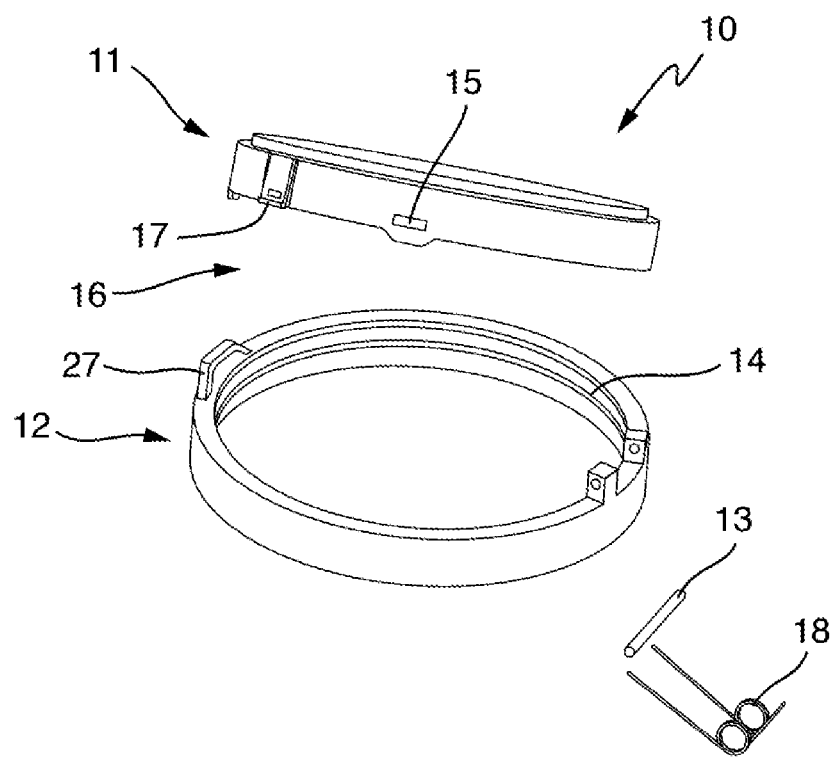

The device unit 2 comprises an interface module 10, which is shown in FIG. 3 based on an exploded drawing. The interface module 10 comprises a communication unit 11, a holding element 12 and a connection 13 for connecting the communication unit 11 to the holding element 12.

The communication unit 11 is suitable for being communicatively connected to an electronics module 20 of the device unit 2. As a result of the communicative connection, the communication unit 11 can input information to the device unit 2 by a user and output information from the device unit 2 to a user. The user can thus communicate with the electronics module 20 of the device unit, for example, to control the sensor or to check the function of the sensor.

The holding element 12 is mechanically connected to the communication unit 11 by means of the connection 13. The communication unit 11 and the holding element 12 are designed to receive the connection 13.

In the embodiment shown in FIG. 3, the connection 13 is a joint, or more precisely a hinge. In an alternative embodiment, however, the connection could also be formed by a different type of joint. The joint allows the communication unit 11 to move relative to the holding element 12. Thus, the communication unit 11 can be moved relative to the holding element 12 between a first folding position A and a second folding position B.

The interface module 10 further comprises a tensioning element 18 suitable for moving the communication unit 11 relative to the holding element 12 from the first folding position A into a second folding position B. The tensioning element 18 can be a spring, for example, as is shown in FIG. 3. Alternatively, the tensioning element 18 could also be a flexible metal strip. Other elements that are able to serve the same purpose could also be used as the tensioning element 18. The tensioning element 18 makes it possible for the user not to personally have to move the communication unit 11 into the second folding position B or to hold it in this folding position. Thus, the use of the interface module 10 becomes more convenient.

As is shown in FIG. 3, the interface module 10 may comprise a locking device 16. Said locking device is suitable for locking the communication unit 11 relative to the holding element 12 in the first folding position A. The locking device 16 comprises a first locking element 17 which is fastened to the communication unit 11 and a second locking element 27 which is fastened to the holding element 12. The locking device 16 can also comprise a plurality of first locking elements 17 and a plurality of second locking elements 27. The first and second locking elements 17, 27 are complementary to one another. The first and second locking elements 17, 27 can each be an elastic detent hook, for example. Alternatively, the locking elements 17, 27 could also be implemented by mutually attracting magnetic elements. The locking device 16 prevents the communication unit 11 from undesirably moving out of the folding position A, for example due to the gravitational forces or tensioning forces acting on the communication unit 11. As a result of the locking elements 17, 27, the use of the interface module 10 thus becomes even more convenient.

In FIG. 3, the holding element 12 is shown in an annular shape and comprises a fastening element 14. The annular holding element 12 can be connected by means of the fastening element 14 to an annular fastening element 24 of the electronics modules 20, which are shown in FIG. 4.

The two fastening elements 14, 24 are complementary and allow the holding element 12 to rotate relative to the electronics module 20 between a first rotational position C and a second rotational position D when the fastening elements 14, 24 are connected to one another. The rotation of the holding element 12 will be discussed later (see also FIG. 6). Depending on the arrangement of the device unit 2, this allows a user to rotate the holding element 12 so that the communication unit 11 can be operated or read more easily. This also makes the use of the interface module 10 more convenient.

As shown in FIG. 3, the communication unit 11 may comprise a tooth 15. The tooth 15 is suitable for engaging in at least a first recess 25 of the electronics module 20 which is complementary to the tooth 15 and which can be seen in FIG. 4. A rotation of the holding element 12 relative to the electronics module 20 can thus be prevented when the tooth 15 engages in the recess 25. A user is thus protected from accidentally turning the communication unit 11 relative to the electronics module 20. This also makes the use of the interface module 10 more convenient.

Figure 4:
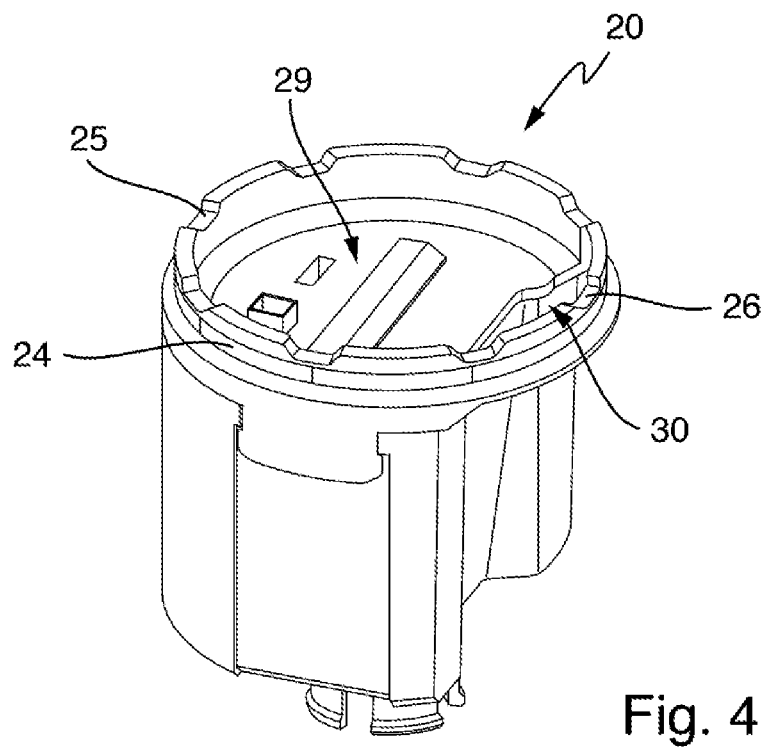

FIG. 4 shows the electronics module 20 of the device unit 2 with the first recess 25 and a second recess 26. The first recess 25 of the electronics module 20 is suitable for receiving the tooth 15 of the communication unit 11 when the holding element 12 is in the first rotational position C relative to the electronics module 20 (see also FIGS. 5 and 6). The second recess 26 of the electronics module 20 is suitable for receiving the tooth 15 of the communication unit 11 when the holding element 12 is in the second rotational position D relative to the electronics module 20 (see also FIGS. 7 and 8). The electronics module 20 can also have a plurality of recesses 25; these are arranged along an edge of the electronics module 20, for example, as can be seen in FIG. 4.

As is shown in FIG. 4, the electronics module 20 has an electronic connection point 29 suitable for receiving a first cable 3. The first cable 3 can be electrically connected to the electronic connection point 29 in order to, for example, supply power to the electronics module 20 or to transmit measurement data via the first cable 3. The electronics module 20 also has an opening 30 suitable for receiving the first cable 3. Thus, the first cable 3 can be easily connected to the electronic connection point 29 through the opening 30.

Figure 5:
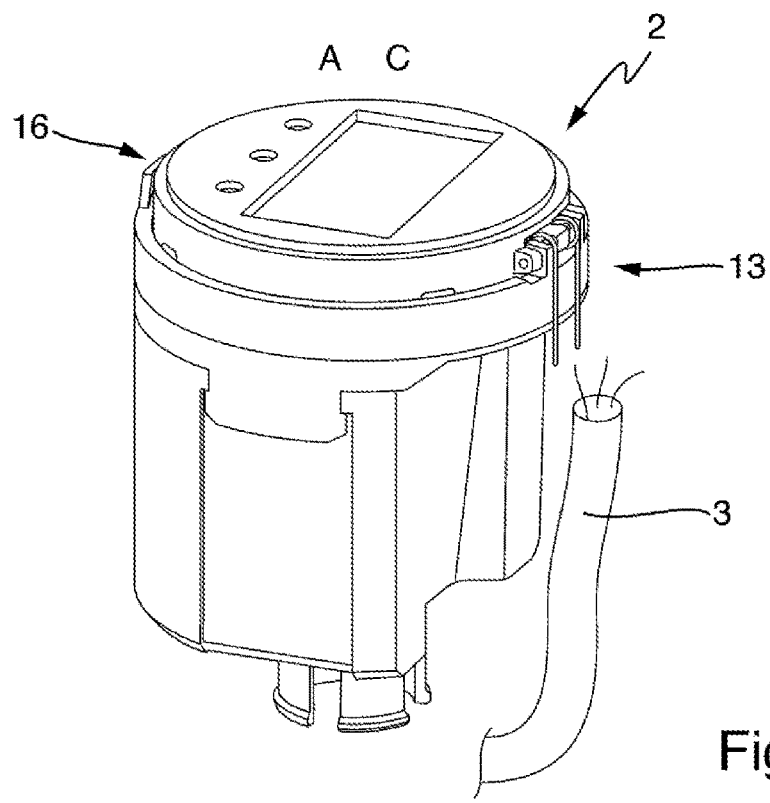

FIG. 5 shows the device unit 2 in which the interface module 10 is connected to the electronics module 20. The communication unit 11 is in the first folding position A. The holding element 12 is in the first rotational position C.

Figure 6:
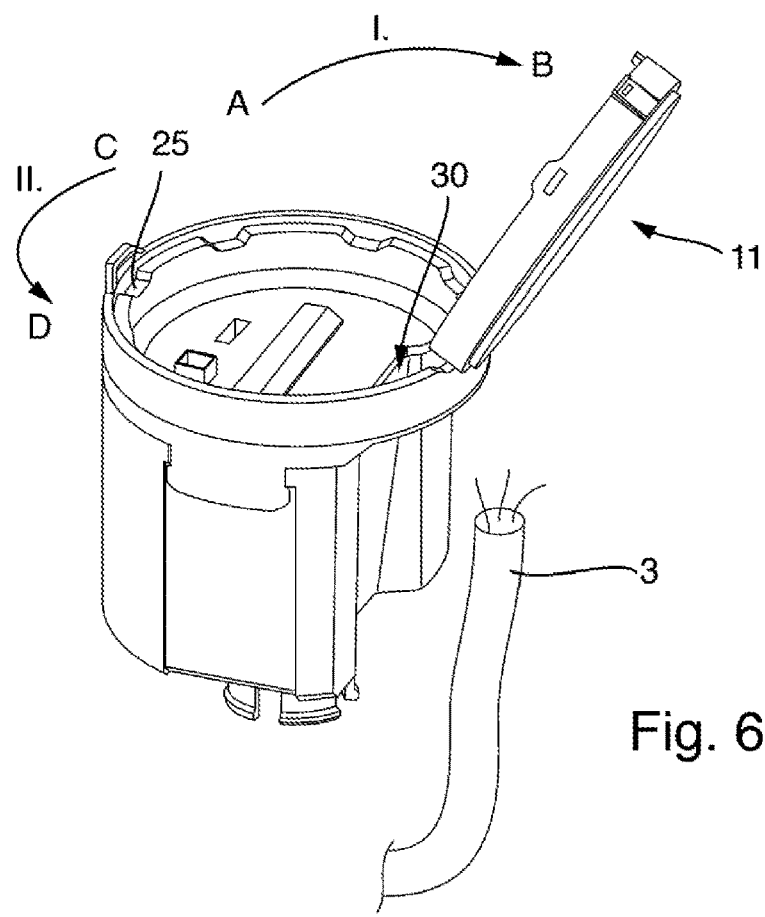

FIG. 6 shows the device unit 2, with the communication unit 11 in the second folding position B. In this folding position, the opening 30 and the electronic connection point 29 of the electronics module 20 are simultaneously accessible to the user. Thus, the user can easily guide the first cable 3 through the opening 3 and connect it to the electronic connection point 29 of the electronics module 20.

Figure 7:
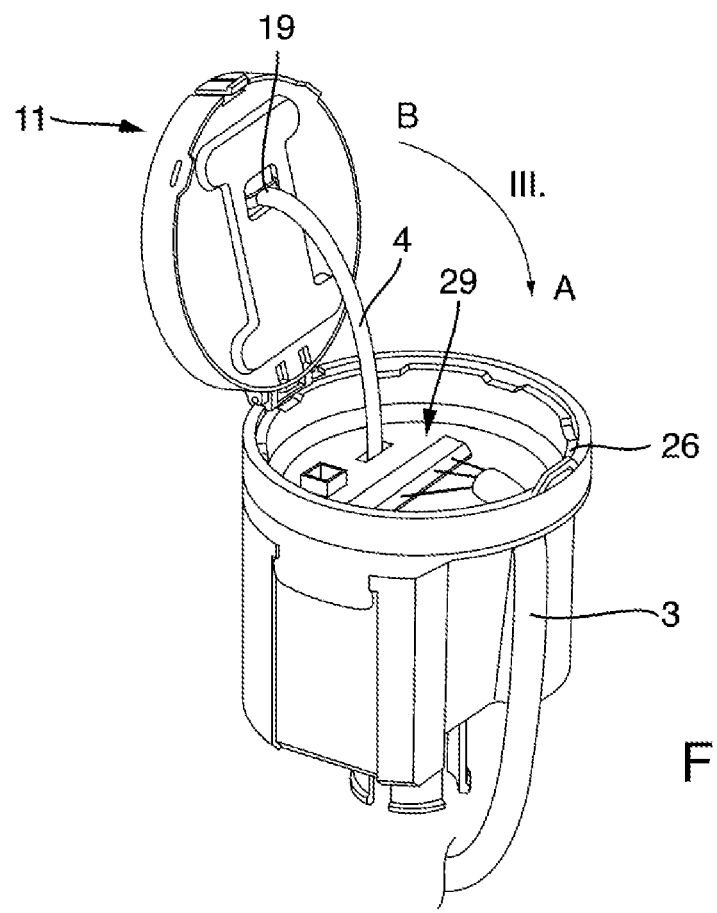

FIG. 7 shows the device unit 2, with the holding element 12 in the second rotational position D. An arbitrary number of further rotational positions can be defined on the annular fastening element 24 of the electronics module 20 based on further recesses in order to enable an ideal orientation of the communication unit 11 for the user in the first folding position A. For example, eight recesses may be formed on the fastening element 24 of the electronics module. Each recess is suitable for receiving the tooth 15 of the interface module 10. FIG. 7 further shows a second cable 4 connecting the communication unit 11 to the electronic connection point 29 of the electronics module 20.

Figure 8:
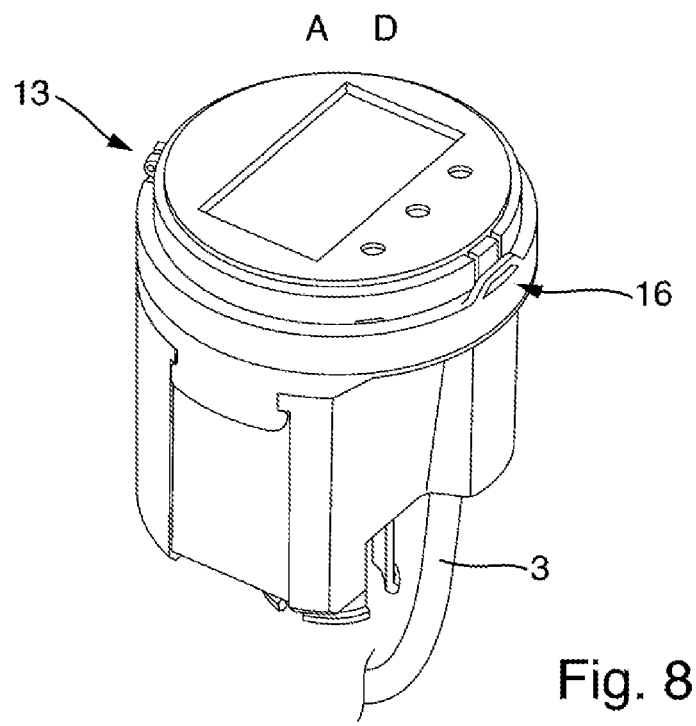

FIG. 8 shows the device unit 2, with the holding element 12 in the second rotational position D and the communication unit 11 in the first folding position A.

The mounting method of the device unit 2 for the transmitter 1 is described below.

In a first mounting step, the holding element 12 of the interface module 10 is fastened to the electronics module 20. This can be done by pressing the fastening element 14 of the holding element 12 onto the fastening element 24 of the electronics module 20. In this embodiment variant, the fastening element 14 or the fastening element 24 is preferably designed to be elastic.

As is apparent from arrow I in FIG. 6, the communication unit 11 of the interface module 10 is subsequently moved from the first folding position A into the second folding position B. This movement can be caused by the tensioning element 18, which is released by the release of the locking device 16. During this step, the tooth 15 of the interface module 10 detaches from the first recess 25 of the electronics module 20. This step allows the electronic connection point 29 of the electronics module 20 to become accessible to an operator for the connection to the first cable 3 and the second cable 4. During or after this step, the first cable 3 can be electrically connected to the electronic connection point 29 in order to, for example, supply the device unit 2 with power. Likewise, during or after this step, the communication unit 11 can be connected to the electronics module 20 by the second cable 4 in order to supply the communication unit 11 with power or to exchange information from the device unit 2 with the communication unit 11.

Optionally, after the step of moving the communication unit 11 of the interface module 10 into the second folding position B, a step of rotating the holding element 12 of the interface module 10 from a first rotational position C into a second rotational position D can be carried out, as is illustrated by arrow II. in FIG. 6.

In a further step, which is indicated by arrow III in FIG. 7, the communication unit 11 of the interface module 10 is moved back into the first folding position A. The tooth 15 of the interface module 10 again engages in the first recess 25 in this process if the holding element 12 has remained in the first rotational position C. However, the tooth 15 of the interface module 10 engages in the second recess 26 if the holding element 12 has been rotated into the second rotational position D.

In an alternative embodiment, the communication unit 11 may be wirelessly connected to the electronics module 20, using a Bluetooth connection, for example.

The invention claimed is:

1. An interface module for a device unit, comprising:
    a communication unit suitable for being communicatively connected to an electronics module of the device unit, the communication unit being suitable for enabling the input of information by a user and the output of information to the user;
    a holding element suitable for being fastened to the electronics module; and
    a connection connecting the communication unit and the holding element to one another,
    wherein the connection is a joint, and the communication unit is movable relative to the holding element between a first folding position and a second folding position via the joint.

2. The interface module according to claim 1, wherein the holding element is annular and includes a fastening element suitable for being connected to an annular fastening element of the electronics module, the two fastening elements allowing the holding element to rotate relative to the electronics module between a first rotational position and a second rotational position when the two fastening elements are connected to one another.

3. The interface module according to claim 2, wherein the communication unit includes a tooth suitable for engaging in at least a first recess of the electronics module which is complementary to the tooth, in order to prevent the holding element from rotating relative to the electronics module when the tooth engages in the recess.

4. The interface module according to claim 1, further comprising:
   a locking device suitable for locking the communication unit in the first folding position relative to the holding element.

5. The interface module according to claim 4, wherein the locking device includes a first locking element fastened to the communication unit and a second locking element fastened to the holding element, wherein the first and second locking elements are complementary to one another.

6. The interface module according to claim 1, further comprising:
   a tensioning element suitable for moving the communication unit relative to the holding element into the second folding position.

7. A device unit for a transmitter, comprising:
   an electronics module;
   an interface module, including:
      a communication unit suitable for being communicatively connected to an electronics module of the device unit, the communication unit being suitable for enabling the input of information by a user and the output of information to the user;
      a holding element suitable for being fastened to the electronics module; and
      a connection connecting the communication unit and the holding element to one another,
      wherein the connection is a joint, and the communication unit is movable relative to the holding element between a first folding position and a second folding position via the joint, and
   wherein the holding element of the interface module is connected to the electronics module.

8. The device unit according to claim 7, wherein the electronics module includes an annular fastening element connected to an annular fastening element of the holding element such that the two fastening elements allow the holding element to rotate relative to the electronics module between a first rotational position and a second rotational position.

9. The device unit according to claim 8, wherein the electronics module further includes a first recess suitable for receiving a tooth of the communication unit which is complementary to the first recess, in order to prevent the holding element from rotating relative to the electronics module when the tooth engages in the recess.

10. The device unit according to claim 9, wherein the electronics module has a second recess, the first recess of the electronics module being suitable for receiving the tooth of the communication unit when the holding element is in the first rotational position relative to the electronics module, and the second recess of the electronics module being suitable for receiving the tooth of the communication unit when the holding element is in the second rotational position relative to the electronics module.

11. The device unit according to claim 7, wherein the electronics module includes an electronic connection point suitable for receiving a first cable, the electronic connection point being accessible to a user when the communication unit is in the second folding position relative to the holding element.

12. The device unit according to claim 11, wherein the communication module includes an electronic connection point, wherein the electronic connection point of the communication module and the electronic connection point of the electronics module being connected to one another by a second cable.

13. The device unit according to claim 11, wherein the electronics module has an opening suitable for receiving the first cable, the opening and the electronic connection point of the electronics module being simultaneously accessible to a user when the communication unit is in the second folding position relative to the holding element.

14. A mounting method of a device unit for a transmitter, the mounting method comprising:
   providing an interface module, including:
      a communication unit suitable for being communicatively connected to an electronics module of the device unit, the communication unit being suitable for enabling the input of information by a user and the output of information to the user;
      a holding element suitable for being fastened to the electronics module; and
      a connection connecting the communication unit and the holding element to one another,
      wherein the connection is a joint, and the communication unit is movable relative to the holding element between a first folding position and a second folding position via the joint;
   providing an electronics module;
   fastening the holding element of the interface module to the electronics module;
   moving the communication unit of the interface module into the second folding position to make an electronic connection point of the electronics module accessible to an operator for the connection to a cable; and
   moving the communication unit of the interface module into the first folding position.

15. The mounting method according to claim 14, further comprising:
   after the step of moving the communication unit of the interface module into the second folding position, rotating the holding element of the interface module from a first rotational position into a second rotational position.

\* \* \* \* \*